US006981241B2

(12) United States Patent
Ludwig et al.

(10) Patent No.: US 6,981,241 B2
(45) Date of Patent: Dec. 27, 2005

(54) METHOD FOR ELIMINATING PHASE CONFLICT CENTERS IN ALTERNATING PHASE MASKS, AND METHOD FOR PRODUCING ALTERNATING PHASE MASKS

(75) Inventors: Burkhard Ludwig, München (DE);
Molela Moukara, München (DE)

(73) Assignee: Infineon Technologies AG, Munich (DE)

( * ) Notice: Subject to any disclaimer, the term of this patent is extended or adjusted under 35 U.S.C. 154(b) by 155 days.

(21) Appl. No.: 10/455,764

(22) Filed: Jun. 5, 2003

(65) Prior Publication Data

US 2003/0229882 A1 Dec. 11, 2003

(30) Foreign Application Priority Data

Jun. 5, 2002 (DE) ................................. 102 24 953

(51) Int. Cl.[7] ............................................. G06F 17/50
(52) U.S. Cl. ............................ 716/21; 716/19; 716/20
(58) Field of Search ...................... 716/19–21; 430/5, 430/311–319

(56) References Cited

U.S. PATENT DOCUMENTS

| 5,537,648 | A | 7/1996 | Liebmann et al. |
| 5,923,562 | A | 7/1999 | Liebmann et al. |
| 5,923,566 | A | 7/1999 | Galan et al. |
| 6,066,180 | A | 5/2000 | Kim et al. |
| 6,083,275 | A | 7/2000 | Heng et al. |
| 6,543,045 | B2 | 4/2003 | Ludwig et al. |
| 6,680,151 | B2 * | 1/2004 | Heissmeier et al. ............ 430/5 |

(Continued)

FOREIGN PATENT DOCUMENTS

| DE | 100 51 134 A1 | 5/2002 |
| DE | 101 19 145 C1 | 11/2002 |
| WO | 02/09152 A2 | 1/2002 |

OTHER PUBLICATIONS

Berman, P. et al., "Optimal phase conflict removal for layout of dark field alternating phase shifting masks", Computer-Aided Design of Integrated Circuits and Systems, IEEE Transactions on , vol.: 19 , Issue: 2 , Feb. 2000. pp.: 175-187.*
Liebmann, L. et al., "Enabling alternating phase shifted mask designs for a full logic gate level: design rules and design rule checking", Design Automation Conference, 2001. Proceedings , Jun. 18-22, 2001. pp.: 79-84.*
Mark D. Levenson et al.: "Improving Resolution in Photolithography with a Phase-Shifting Mask", *IEEE Transactions on Electron Devices*, vol. ED-29, No. 12, Dec. 1982, pp. 1828-1836.

(Continued)

*Primary Examiner*—Matthew Smith
*Assistant Examiner*—Naum Levin
(74) *Attorney, Agent, or Firm*—Laurence A. Greenberg; Werner H. Stemer; Ralph E. Locher

(57) ABSTRACT

In order to eliminate phase conflicts in alternating phase masks, the layout is modified after the phase conflicts have been localized. During the modification, degenerate critical structures, which fall below a minimum width and require phase-shifting regions for their adequate imaging, are widened, so that the phase-shifting regions directly adjoining the degenerate critical structures disappear. Moreover, interaction regions between phase-shifting regions can be eliminated by trimming masks, intermediate phases or shifting associated critical structures.

18 Claims, 11 Drawing Sheets

U.S. PATENT DOCUMENTS

| | | | |
|---|---|---|---|
| 6,730,463 B2 * | 5/2004 | Heissmeier et al. | 430/394 |
| 6,785,879 B2 * | 8/2004 | Pierrat | 716/21 |
| 6,787,271 B2 * | 9/2004 | Cote et al. | 430/5 |
| 6,811,954 B1 * | 11/2004 | Fukuda | 430/311 |
| 6,832,364 B2 * | 12/2004 | Heng et al. | 716/21 |
| 2002/0046392 A1 | 4/2002 | Ludwig et al. | |
| 2002/0155362 A1 | 10/2002 | Heissmeier et al. | |
| 2003/0140331 A1 * | 7/2003 | Ludwig et al. | 716/19 |

OTHER PUBLICATIONS

Mark D. Levenson: "Wavefront Engineering For Photolithography", *Physics Today*, Jul. 1993, pp. 28-36.

Akemi Moniwa et al.: "Heuristic Method for Phase-Conflict Minimization in Automatic Phase-Shift Mask Design", *Jpn. J. Appl. Phys.*, vol. 34, 1995, pp. 6584-6589.

* cited by examiner

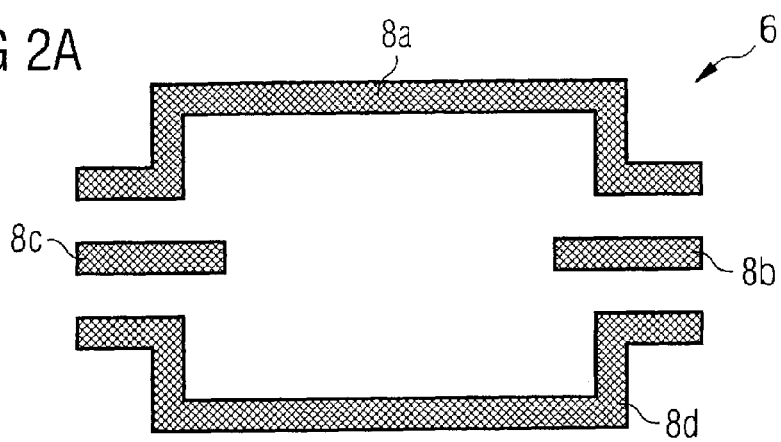
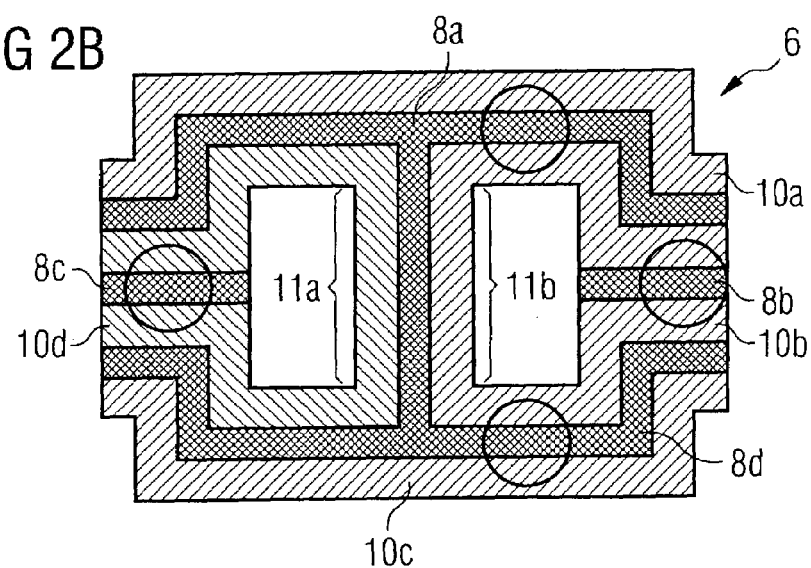
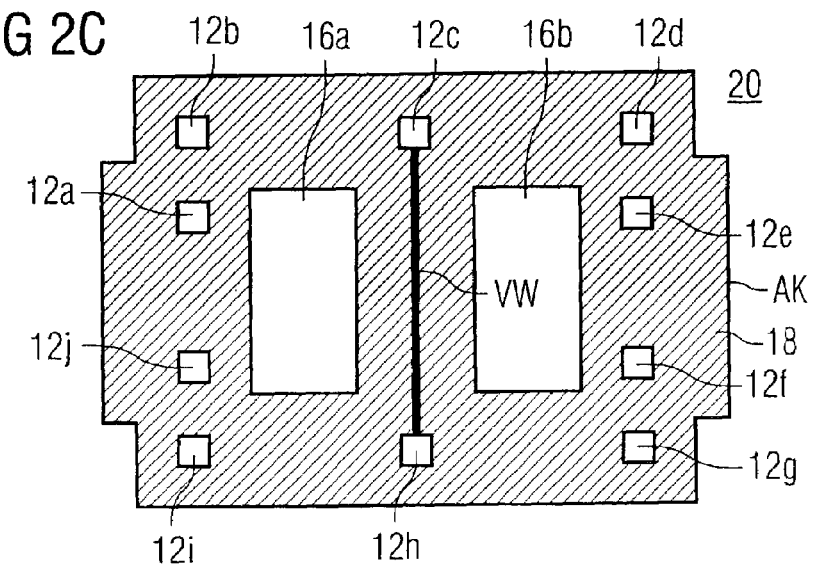

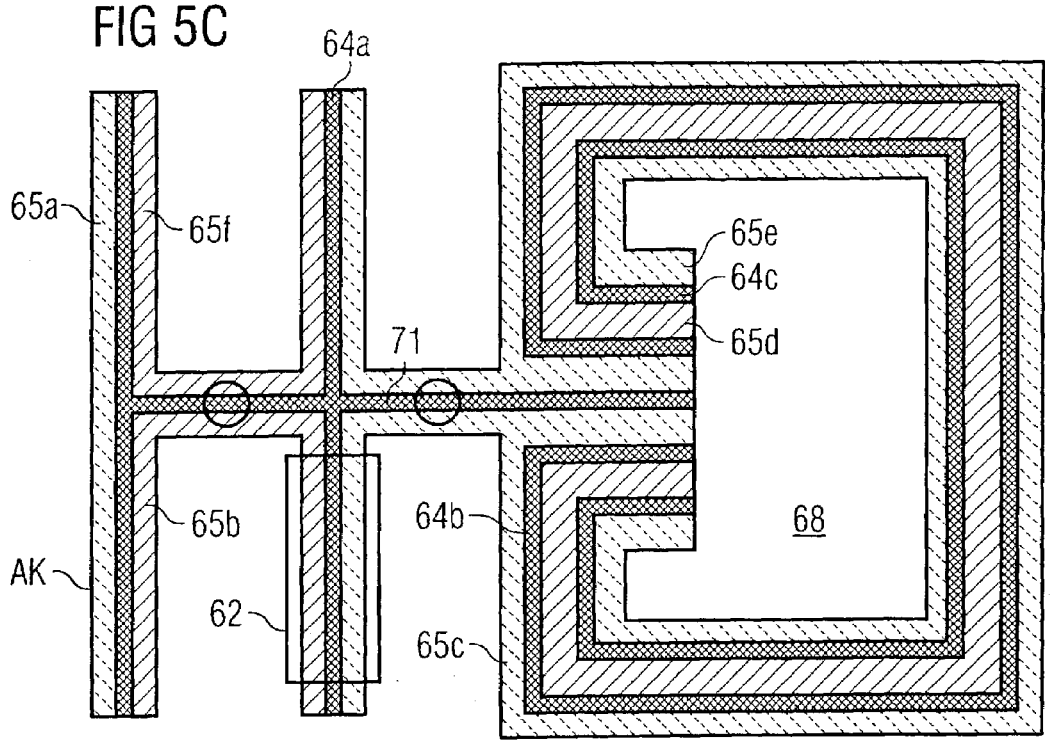
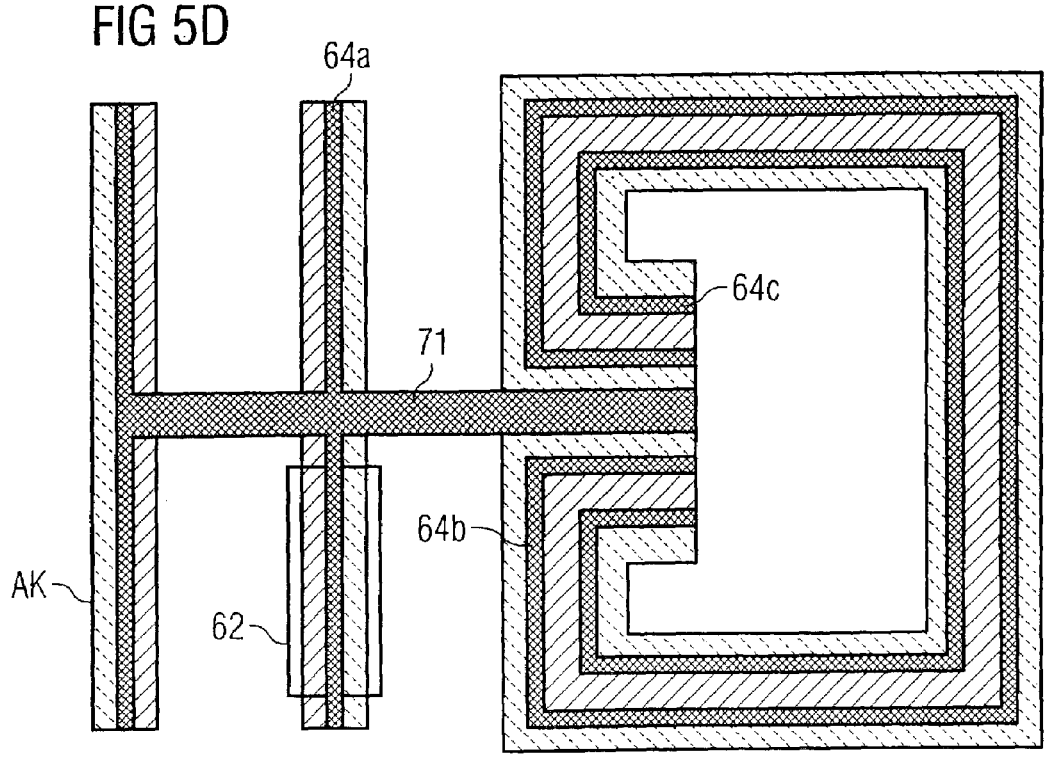

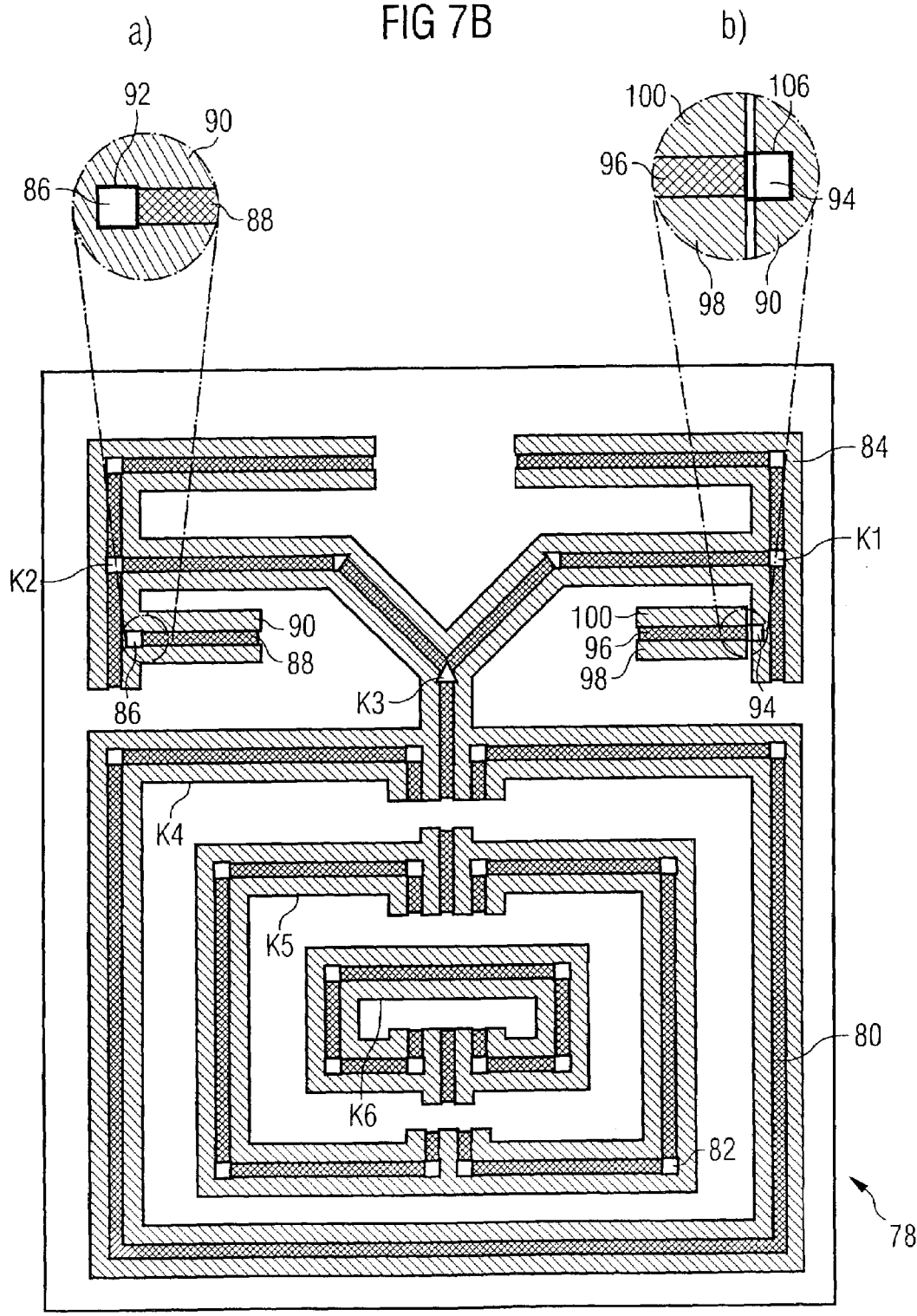

METHOD FOR ELIMINATING PHASE CONFLICT CENTERS IN ALTERNATING PHASE MASKS, AND METHOD FOR PRODUCING ALTERNATING PHASE MASKS

BACKGROUND OF THE INVENTION

FIELD OF THE INVENTION

The invention lies in the semiconductor technology field and concerns, generally, the field of the fabrication of integrated semiconductor circuits such as VLSI and ULSI circuits by photolithographic methods. More specifically, the invention relates to increasing the resolution of conventional photolithography by using alternating phase masks.

In the fabrication of integrated semiconductor circuits, the mask structures assigned to the circuit elements are optically imaged in a conventional manner onto light-sensitive layers on the wafer. On account of the diffraction effects, the resolution of such an imaging system is limited, and mask structures with dimensions below the reciprocal value of this resolution, the so-called critical structures, are imaged with blurring and in unsharp fashion. This leads to undesirable strong correlations between the circuit elements and thus to an impairment of the circuit functionality.

These difficulties can be overcome by utilizing the destructive interference effect of two closely adjacent and coherent light beams with phases shifted by 180° relative to one another, and by converting the conventional masks affected into alternating phase masks in which each critical structure is provided with two phase shifters for producing the required phase shift.

The various types of phase masks are described for example in the book "Technologie hochintegrierter Schaltungen" ["Technology of large scale integrated circuits"] by Widmann, Mader and Friedrich, 2nd ed., Springer-Verlag, p. 135 et seq. An extensive overview of phase mask technology is contained in the publications "Improving Resolution in Photolithography with a Phase-Shifting Mask" by M. D. Levenson, et al. in IEEE Trans. Electron. Devices 29 (1982), 1828 et seq. and "Wavefront Engineering for Photolithography", by M. D. Levenson in Physics Today, July 1993, p. 28 et seq.

The use of so-called strong phase masks, which include both the alternating phase masks already mentioned and chromium-free phase masks, requires the transparent phase-shifting regions in each affected plane to be allocated to one of two phases which have a phase difference $\Delta\phi=180°$. Here it is necessary to distinguish between the following two cases: In the case of a so-called dark-field phase mask, transparent structures correspond to the circuit elements (e.g. interconnects) and phases can be allocated to them, while non-transparent mask fields are formed by regions covered with chromium. By contrast, in the case of a so-called bright-field phase mask, the chromium-covered non-transparent regions of the phase mask represent the circuit elements and the regions lying in between are transparent. In the latter case, it is necessary to determine suitable regions in the vicinity of the non-transparent chromium regions as phase-shifting regions. The creation of the phase-shifting regions is effected according to specific design rules that are known per se in the art and the process is described, for example, in U.S. Pat. Nos. 5,537,648 and 6,066,180. The two patents are hereby incorporated by reference into the disclosure of the present application.

In view of the complexity of modern circuits and the requirement for two phase-shifting regions shifted by 180° on each critical structure, phase conflicts are conceivable, however. A phase conflict is present precisely when the same phase is incorrectly allocated to the phase-shifting regions on both sides of a critical structure, or when, on account of the interaction of the phase-shifting regions, the destructive interference effect occurs at an undesired point on the aforementioned light-sensitive layer. The phase allocation for the different phase-shifting regions thus represents a mathematical-combinatorial problem, which cannot generally be solved. Since the phase allocation can lead to different results, in principle, and different phase allocations can be effected for one and the same cell of a hierarchical layout, the phase allocation has to be performed in an automated program finally on the finished circuit layout. Therefore, an automated checking routine is required which examines a circuit layout to determine whether a phase allocation is actually possible. This checking should be complete and delimit the problem point as well as possible, i.e. determine its actual origin. The latter, however, is not self-evident because if the combinatorial task "does not work out," then this is possible in diverse ways and the location at which this is discovered to be the case may be far away from the actual origin. The actual origin is also referred to as a phase conflict center.

Once phase conflicts have been ascertained in an automated routine, they can be resolved in various ways. By way of example, individual phase-shifting regions may be allocated two different phases. However, the consequence of this is that a dark line occurs during the exposure at the boundary line between the two different phase regions. The dark line would lead to an interruption. Therefore, in this case it is necessary to carry out an additional exposure step using a so-called trimming mask, by way of which the dark lines that occur are exposed separately. As an alternative, it is possible to introduce intermediate phases along the boundary lines.

Various methods for checking a layout for phase conflicts are known in the prior art.

The publication "Heuristic Method for Phase-Conflict Minimization in Automatic Phase-Shift Mask Design" by A. Moniwa et al. in Jpn. J. Appl. Phys., Vol. 34 (1995), pp. 6584–6589, discloses a graph theory approach in which a set of phase-shifting elements is presupposed and a planar nondirectional graph is formed from said set taking account of the technological requirements. In this graph theory method, graph nodes (vertices) represent phase-shifting regions. A graph edge between two nodes means that the region between the associated phase shifters is lithographically critical. Phase conflicts emerge in this method as those cycles with an odd number of vertices. On account of the meaning of the graph edges, a cycle break, i.e. resolution of a phase conflict, is equivalent to a widening of the corresponding critical region. According to the method mentioned, an efficient conflict resolution strategy is said to consist in breaking the edges occurring most often in the odd cycles.

U.S. Pat. No. 5,923,566 describes a computer-implemented routine which verifies whether a circuit design present can be imaged onto a phase mask or whether localized phase conflicts are present. The phase conflicts are detected from the interaction of critical circuit regions with the contiguous free circuit regions to be determined taking account of the technological requirements. Free circuit regions with an odd number of interactions represent the phase conflicts.

However, both methods described above do not operate optimally in detecting phase conflicts. Moreover, these methods prove to be inefficient, on the one hand, since, for example, specific phase conflicts are indicated twice in said methods, and inadequate, on the other hand, since specific other phase conflicts cannot be detected by said methods.

Thus, the phase conflicts cannot be detected correctly by the identification methods known in the prior art. Consequently, a conflict elimination method which uses the results of the identification method to eliminate the phase conflicts identified also cannot lead to optimum results.

An improved method by comparison therewith is described in international publication WO 02/09152 A2 and our co-pending application 10/352,735, in which free inner regions of layout groups are determined and a check is made to establish whether the outer contour thereof makes contact with an odd number of degenerate critical structures. Free regions lying outside layout groups are not taken into account, on the other hand. All phase conflicts can be reliably determined with this method.

The aim of identifying phase conflicts is ultimately to eliminate them, so that phase-shifting regions with different phases can be arranged on both sides of each critical structure.

Our commonly assigned U.S. Pat. No. 6,543,045 (German DE 100 51134 A1 and US 2002/0046392 A1) effects this by separating initial uniform phase-shifting regions into two or more phase-shifting regions with different phases at each separation line. The initial uniform phase-shifting region is accordingly decomposed in a suitable manner. This is tantamount to a suitable definition of phase jumps in the initially phase-shifting region. This increases the degree of freedom in the assignment of the phase. Since destructive interference occurs along the separation line between the individual phase-shifting regions created during the imaging of the mask, this region has to be subsequently exposed using an additional mask, the trimming mask. The phase jumps which occur as a result of the decomposition are often also referred to as "microphase jumps" or, given a vanishing width, as chromium-free transitions. As an alternative, it is also possible to work with intermediate phases along the separation line, but this is associated with higher costs. The trimming mask is usually a conventional mask, a COG mask (chromium on glass), which is considerably more cost-effective than a trimming mask with phases.

Microphase jumps have the advantage that the actual layout, i.e. the structures to be imaged, is not altered, as a result of which miniaturization of the entire layout to be imaged is made possible in a simple manner. However, the required trimming openings in the trimming mask are often so large or delocalized that the corresponding trimming masks cannot be derived. In customary circuits (VLSI, ULSI), there is even a need for expensive alternating trimming masks on account of propagating phase conflicts.

A different approach is taken by U.S. Pat. No. 5,923,566 mentioned further above. There, after identifying a phase conflict, the person entrusted with creating the mask makes a change to the layout design according to empirical rules and then uses the same method to check whether or not the phase conflict has been eliminated. Rules as to the way in which the layout modification is to be carried out cannot be gathered from U.S. Pat. No. 5,923,566. Ultimately, this method can only indicate phase conflicts. The elimination depends on the skill of the respective layout designer.

A further method for eliminating phase conflicts is described in U.S. Pat. No. 5,923,562, in which critical T-shaped structures are detected and a respective limb of the critical T-shaped structures detected is widened, so that phase-shifting regions are no longer necessary along said limb. The T-geometry is a basic assumption of this method. The remaining phase conflicts which can occur independently of the presence of T-shaped structures are not resolved. Thus, this method merely reduces the number of phase conflicts, but does not solve the global 2-coloration problem.

In a further method in accordance with U.S. Pat. No. 6,083,275, a check is made, on the basis of empirical design rules established, to determine whether the arrangement of the structures of the predetermined layout satisfies these rules. If this is not true, the corresponding regions are marked and the layout is then modified on the basis of cost consequential criteria until it satisfies the design rules. Accordingly, this method is intended to change the layout as early as in the front end such that phase conflicts can be avoided. However, not all phase conflicts can thus be eliminated, since the high complexity of the layout of present-day integrated circuits means that a multiplicity of phase conflicts occur whose actual cause may be delocalized relative to the phase conflict that can be concretely identified.

SUMMARY OF THE INVENTION

It is accordingly an object of the invention to provide a method of resolving phase conflict centers in alternating phase masks which overcomes the above-mentioned disadvantages of the heretofore-known devices and methods of this general type and which provides a method in which phase conflicts in arbitrary layouts can be resolved reliably and satisfactorily.

With the foregoing and other objects in view there is provided, in accordance with the invention, method of eliminating phase conflict centers in alternating phase masks, wherein a predetermined layout having structures provided for imaging is taken as a basis, the method which comprises the following steps:

a) determining critical structures having a width less than a predetermined width W and being bounded by phase-shifting regions on both sides;

b) determining:

overlap regions between straight segments of the critical structures, interaction regions between phase-shifting regions; and end regions of the critical structures, degenerate critical structures formed by subtracting the overlap regions from the critical structures;

c) forming layout groups by combining degenerate critical structures, phase-shifting regions, and interaction regions between phase-shifting regions minus all the end regions;

d) forming outer boundaries around free regions within the layout groups, and thereby determining from each outer boundary a number of paths of contact with the degenerate critical structures and ascertaining a phase conflict center if the number is an odd number;

e) determining combinatorial connection paths either connecting two outer boundaries representing phase conflict centers to one another or connecting an outer boundary representing a phase conflict center to the outer contour of a layout group thereof, wherein only an odd number of combinatorial connection paths proceed from each outer boundary representing a phase conflict center; and f) modifying degenerate critical structures and interaction regions and also, if appropriate, overlap regions running along the combinatorial connection paths or being in contact therewith, to thereby eliminate the phase conflict centers.

The object is firstly to determine all outer boundaries of free regions which indicate phase conflict centers. Afterward, an as minimal as possible a set of combinatorial connection paths is then sought and the degenerate critical structures and interaction regions and also, if appropriate, overlap regions which run along said connection paths or make contact with the latter are modified, their modification (manipulation by widening or shifting) leading to the elimination of the phase conflict centers. The combinatorial connection paths preferably run along critical or degenerate critical structures, their overlap regions and interaction regions, since only the modification of such structures leads to the alteration of phase-shifting regions and thus to the elimination of the phase conflict centers and ultimately of the phase conflicts that can actually be observed. The fact of whether such a modification leads to the desired result can be identified for example from whether the layout modification leads to a separation of phase-shifting regions as a consequence of which outer boundaries indicating phase conflict centers are interconnected or connected to the outer contour. In concrete terms, this means, for example, that widening of a degenerate critical structure obviates the need for phase-shifting regions.

In other words, the aim essentially is to conceptually increase or decrease by an odd number the number of degenerate critical structures adjoining the outer boundaries representing a phase conflict center. Phase conflicts on account of interaction regions can be eliminated here by shifting and/or widening adjoining degenerate critical structures.

In the context of the invention, a layout is understood as the totality of all the circuit elements and their distances between one another, i.e. the geometrical arrangement of the structures to be imaged. Phase-shifting regions, on the other hand, represent auxiliary structures which serve to improve the imageability of the layout.

With the method according to the invention, the layout modification generates so-called "macrophase jumps", by means of which phase conflicts are eliminated.

In order to realize the combinatorial connection paths, use is made of combinatorial elements from the general combinatorial base comprising all degenerate critical structures and all interaction regions between the phase-shifting regions. Those combinatorial elements which lie in selected layout regions not provided for modification are preferably disregarded here.

The term reduced base is used in this case. An extended base is the term used, by contrast, when including the overlap regions and, if appropriate, the outer boundaries representing no phase conflict centers. In this case, with regard to the elements of the extended base, the term extended elements is also used since they are formed by combination of, in contact with one another, degenerate critical structures, overlap regions and outer boundaries representing no phase conflict centers.

A minimal quantity of connection paths is to be sought here. Therefore, the number of combinatorial connection paths is preferably reduced to an extent such that each outer boundary representing a phase conflict center is assigned to precisely one combinatorial connection path. It is possible here for combinatorial connection paths also to run through outer boundaries of phase conflict centers that have already been resolved or through outer boundaries representing no phase conflict centers.

In the simplest case, the combinatorial connection paths are intended to connect two outer boundaries each indicating a phase conflict center (pairwise combination of outer boundaries representing phase conflict centers) or an outer boundary indicating a phase center to the outer contour of its layout group. In this case, the combinatorial connection paths may run, depending on the respective layout, along degenerate critical structures, interaction regions and overlap regions. Those elements which lead to a corresponding combinatorial connection path are then sought from the abovementioned base of all combinatorial elements (normal, extended or reduced base). Start and end points of combinatorial connection paths are prescribed by the outer boundaries representing phase conflict centers and the outer contour of the respective layout group. However, that point on the outer contour or the outer boundary representing a phase conflict center at which the respective combinatorial connection path begins is initially still open. A number of possibilities exist particularly with comparatively large outer boundaries and outer contours.

In the selection of the elements from the combinatorial base which ultimately form the combinatorial connection path, e.g. those degenerate critical structures which make direct contact with outer boundaries representing a phase conflict can be taken as a basis. Such degenerate critical structures are also referred to as longitudinally correlated degenerate critical structures. The combinatorial connection path runs along these degenerate critical structures in this case.

As an alternative or in addition to this procedure, it is possible to take account of those degenerate critical structures which, although they themselves do not come directly into contact with the outer boundary indicating a phase conflict, their phase-shifting regions make contact with said outer boundary. The term laterally correlated degenerate critical structures is also used for such "indirect" contact being made between the outer boundaries and the phase-shifting regions of degenerate critical structures. In this case, the combinatorial connection path crosses the degenerate critical structure, i.e. it runs transversely with respect thereto.

The fact of whether longitudinally or transversely correlated degenerate critical structures or both types are used to form the combinatorial connection paths ultimately depends on the respective layout.

Furthermore, it is not necessary for each combinatorial connection path to make contact with both degenerate critical structures, interaction regions and overlap regions. In the simplest case, a combinatorial connection path can run along a single degenerate critical structure or transversely with respect thereto. It should be taken into consideration that combinatorial connection paths can also run via phase-shifting regions.

If a minimal quantity of combinatorial connection paths has been found, then the degenerate critical structures, interaction regions and overlap regions which run along said combinatorial connection paths or make contact with or are crossed by the latter are modified such that the phase conflict centers are eliminated.

In other words, ultimately a minimal set of degenerate critical structures and interaction regions and also, if appropriate, overlap regions within each layout group is determined which lead, through modification, to a union of either an even number of outer boundaries representing phase conflict centers among one another or to a union of outer boundaries representing phase conflict centers with the outer contour of the respective layout group. The combinatorial connection paths merely represent a preferred procedure here as to how said minimal set can be determined.

Generally, the search for combinatorial connection paths can be summarized as follows:

a) All objects for solving the combinatorial problem (2-coloration problem) are determined.

b) A suitable combinatorial phase (general, reduced or extended) is formed from degenerate critical structures, interaction regions and overlap regions;

c) All elements from the base formed are related to all outer boundaries and outer contours by lateral and/or longitudinal correlation. Base elements of the respective base then lead, in the general case, each outer boundary to its nearest neighbors (outer boundary of other phase conflict centers, outer boundaries which represent no phase conflict centers or outer contours).

d) The minimal quantity of elements to be modified is determined as follows:

Only outer boundaries representing phase conflict centers are considered.

The procedure begins in each case at an outer boundary representing an unresolved phase conflict center and then seeks base elements which lead to a resolution (i.e. to an outer boundary of an unresolved phase conflict center, an odd number of outer boundaries of unresolved phase conflict centers or to the outer contour).

If no base element having this property exists, other base elements are taken into account which lead to outer boundaries of phase conflict centers that have already been resolved or to outer boundaries free of phase conflicts.

The phase conflict respectively considered is eliminated when one or more resolution partners have been found.

The determination is preferably effected in a layout group by layout group manner. Loops are avoided with the procedure described above.

A preferred boundary condition in the search for the combinatorial connection paths is that ultimately the number of structures to be modified (combinatorial elements) is intended to be as low as possible in order to keep the layout modification as minimal as possible.

The modification of the layout is preferably effected by at least partial widening and/or partial shifting of degenerate critical structures and, if appropriate, of overlap regions.

In addition or as an alternative to the modification of the layout, it is also possible, in the region of the interaction regions, to eliminate phase conflicts that occur there by introducing phase-shifting regions with an intermediate phase. Intermediate phase means that the phase of this phase-shifting region lies between the phases of the adjoining phase-shifting regions.

A further possibility consists in separating phase-shifting regions along combinatorial connection paths and assigning a different phase to the separate parts. The separation lines that are concomitantly imaged as a result during the exposure are subsequently exposed by means of trimming masks.

Reliably finding the phase conflict centers is a prerequisite. This is possible, by way of example, with the method disclosed in our copending application 10/352,735 and in the corresponding PCT publication WO 02/09152 already cited, the disclosure content of which is hereby fully incorporated. The basic principles of this method will be set forth below in order to provide a better understanding.

Proceeding from a predetermined layout, firstly the critical structures and the associated phase-shifting regions are determined. The critical structures are nontransparent structures whose width falls below a predetermined minimum value W. The value W depends, in particular, on the wavelength used for imaging. Adequate imaging is ensured in the case of structures which are wider than W, for which reason these structures require no phase-shifting regions. These structures, referred to as noncritical hereinafter, are not taken into account in the determination of the phase conflict centers.

The value W is closely connected with the resolution of the optical system used for imaging the mask. The size R of the smallest structure that can be imaged with the optical system is given by $$R=k_1*\lambda/NA$$

where $\lambda$ is the wavelength of the radiation used for imaging

NA is the numerical aperture of the optical imaging arrangement $k_1$ is a process-dependent constant.

In many cases, in particular in the area of so-called sub-wavelength lithography, $k_1 \approx NA$ holds true, so that $R \approx \lambda$. The imaging of all structures which are smaller than R necessitates resolution enhancement techniques, for example alternating phase masks. Therefore, $W \approx R$ can be set to a first approximation.

The assignment of phase-shifting regions to critical structures can be effected for example by the method in accordance with the above-mentioned U.S. Pat. No. 5,537,648, which is incorporated by reference.

In a further step b), overlap regions between straight sections of critical structures are determined. This is done at bend points for example by conceptually lengthening the critical structures beyond their end points. The overlap of critical structures which results on account of this lengthening is marked as overlap region. The background to this measure is that each bend in a critical structure, e.g. the connection point of a T-shaped structure, may in principle be the starting point, i.e. phase conflict center, or cause of a phase conflict. Whether this is the case is determined in a later method stage.

Furthermore, interaction regions between phase-shifting regions are determined. This involves regions in which a predetermined distance between the phase-shifting regions is undershot. Undesirable interference phenomena occur in these regions.

Afterward, end regions are determined at critical end edges by infinitesimal inflation or enlargement of the critical end edges toward the outside.

Degenerate critical structures are then determined by subtracting the overlap regions from the critical structures. Accordingly, the degenerate critical structures are merely individual straight sections of the original critical structures. If a critical structure has no overlap region, a degenerate critical structure is formed from it without subtraction.

The layout groups are formed in a next step. Generally, a union of all degenerate critical structures, phase-shifting regions and the interaction regions thereof minus all end regions is taken as a basis here. As a result, firstly a so-called "combinatorial layout region" is produced, which is generally not contiguous. However, it can be decomposed in an unambiguous manner into combinatorially independent, multiply contiguous regions, the so-called layout groups. These are "combinatorially independent" of one another because a phase can be assigned to the phase-shifting regions occurring in each layout group independently of the phase-shifting regions of other layout groups. Moreover, the phase conflict centers can be eliminated in a layout group by layout group manner without influencing adjacent layout groups. Noncritical structures are not included in the layout groups.

The formation of layout groups by union of critical structures, phase-shifting regions, interaction regions between phase-shifting regions minus the overlap regions and all end regions is an alternative and equivalent.

Furthermore, the phase conflict centers are determined in step d). To that end, firstly outer boundaries around all the free regions within each layout group are formed. These outer boundaries are also referred to as "combinatorial contours". They are determined by covering the outer contours of the free regions in the mathematically positive sense, i.e. in the counter-clockwise direction. Combinatorial contours or outer boundaries are then understood to be all those contours in which the free regions lie "on the left" or, to put it another way, in which the non-free regions lie "on the right". The free regions within the layout groups are, in particular, end sections, overlap regions and regions lying outside the phase-shifting regions, the interaction regions and the critical structures. After construction, free regions lying within each layout group are singly contiguous regions and consequently have in each case only one edge, i.e. one outer contour, and thus one outer boundary.

The fact of whether an outer boundary represents or indicates a phase conflict center depends on the number of degenerate critical structures with which it makes contact. If the number is even, the outer boundary represents or indicates no phase conflict center. This is the case e.g. with the outer boundary assigned to the overlap region of a simple L-shaped structure. By contrast, if the number is odd, the respective outer boundary indicates a phase conflict center. A typical example is the outer boundary assigned to the overlap region of a T-shaped structure. The outer boundaries indicating phase conflict centers are marked.

It may perfectly well happen that the cause of a phase conflict and the actual occurrence of a phase conflict, i.e. the erroneous assignment of the phase on both sides of a critical structure, are spatially separate from one another. The method steps described above unambiguously determine the actual causes of the phase conflicts, the phase conflict centers, whose effects, by contrast, may occur elsewhere in the layout.

The reason why the cause of the phase conflict and the phase conflict actually observed may spatially diverge resides in the ambiguity of the phase allocation. For the allocation of phases to individual phase-shifting regions, there are a plurality of possibilities, in principle, particularly with a large number of phase-shifting regions. This ambiguity is known e.g. from the known mathematical problem of the coloration of maps, in which neighboring countries having a common border are each intended to have a different color.

Consequently, the determination of the phase conflict centers is effected independently of the phase allocation specifically present and of the phase conflicts observed in this case. This is highly advantageous since, on the one hand, a complete and reliable determination of the actual causes of the phase conflicts is made possible and, on the other hand, the actual assignment of the phases can be chosen freely.

A phase assignment free of phase conflicts is actually possible in the first place as a result of the elimination of the phase conflict centers (causes of the phase conflicts), i.e. the combinatorial problem of the two-coloration of the phase-shifting regions can be solved in a manner free of conflicts.

End regions and overlap regions are also referred to as virtual lands since they cannot be identified as free regions per se in the combinatorial group (phase-shifting regions, critical structures and interaction regions) of the originally predetermined layout. The virtual lands are in each case bounded by their outer boundary.

By contrast, free regions covered neither by the phase-shifting regions, the interaction regions nor by the critical structures are referred to as real lands.

Non-combinatorial contour of a layout region is understood to be that mathematically positively oriented edge in which the non-free region lies "on the left", or the free region lies "on the right". For the sake of simplicity, non-combinatorial contours of layout groups are also referred to as outer contours of these layout groups. Thus, the quantity of all outer contours of all layout groups is identical to the totality of all mathematically positively oriented edges of the associated combinatorial layout region in which the non-free regions lie "on the left".

The aim of eliminating a phase conflict center is to increase or decrease by an odd number the number of degenerate critical structures making contact with its outer boundary (combinatorial contour). The degenerate critical structures are increased or decreased for example using "combinatorial connection paths" having the essential property that each connection path either connects two outer boundaries representing phase conflict centers to one another or connects an outer boundary representing a phase conflict center to the outer contour of its layout group. To put it another way, a phase conflict center is generally eliminated if an odd number of combinatorial connection paths proceed from the outer boundary that indicates or represents said phase conflict centers.

Owing to the combinatorial independence of the layout groups, the elimination of the phase conflict centers is effected efficiently in a layout group by layout group manner.

Moreover, it suffices, if appropriate including resolved phase conflict centers or outer boundaries representing no phase conflict centers, to form a quantity of pairs of phase conflict centers and the outer contour of the layout group in which each phase conflict center occurs only once.

The degenerate critical structures, interaction regions and, if appropriate, overlap regions are modified along the combinatorial connection paths determined. These structures and overlap regions form a minimal set of structures to be modified. It is also possible for degenerate critical structures to be partially modified, e.g. in particular widened in sections.

The combinatorial connections paths represent an aid for determining the structures to be modified, i.e. the elements that can be manipulated. In order to minimize their number, it is endeavored that combinatorial connection paths make contact as far as possible only once with each outer boundary indicating a phase conflict center. To put it another way, it is attempted to minimize the number of combinatorial connection paths required. In this case, the combinatorial connection paths may assume very complex forms and also run through outer boundaries of free regions which represent no phase conflict centers or phase conflict centers that have already been resolved.

In the determination of this minimal set, it is possible e.g. firstly to search for those combinatorial connection paths which only interconnect two outer boundaries each indicating a phase conflict center or connect an outer boundary indicating a phase conflict center to the outer contour of the respective layout group. If such combinatorial connection paths have been determined, one or even two phase conflict centers can be eliminated by widening the degenerate critical structures running along these connection paths. The widening of the degenerate critical structure may be linked e.g. to the omission of the phase-shifting regions surrounding it. Accordingly, the degenerate critical structures are widened to such an extent, for example to the width W or beyond, that phase-shifting regions are no longer necessary. In other words, the degenerate critical structure undergoes transition to a non-critical structure. Hitherto contiguous phase-shifting regions are separated by the omission of the associated phase-shifting regions. The omitted part is accordingly separated out from the hitherto contiguous phase-shifting regions. As a result, the lands hitherto adjoining said degenerate critical structure, or the outer boundaries of said lands, are enlarged to such an extent that they merge with one another.

As a result of the modification of the degenerate critical structures or overlap regions in accordance with step f), the number of degenerate critical structures making contact with the outer boundaries is reduced by an odd number, usually one, i.e. the phase conflict center is eliminated.

In the shifting of degenerate critical structures, a separation of phase-shifting regions which enables an arbitrary assignment of different phases to the now separate phase-shifting regions likewise occurs, for example.

It is advantageous that the elimination of the phase conflicts within the layout groups can be carried out independently of other layout groups.

If necessary, specific degenerate critical structures can be excluded from the modification. This is necessary e.g. when these make contact with selected layout regions. The latter include, in particular, those regions in which the dimensions of the structures are of great importance for the functionality of the integrated circuit to be formed. The width of gate structures shall be mentioned as an example. In concrete terms, this means that the combinatorial connection paths are determined such that they do not run through selected layout regions not provided for modification, so that no modification of degenerate critical structures, interaction regions and overlap regions is effected in the selected layout regions. The reduced combinatorial base, which is reduced by the combinatorial elements lying within the selected layout region, is used in this case. This procedure is particularly suitable if no phase conflict centers lie in the selected layout regions.

In order to resolve phase conflicts occurring in the selected layout regions, therefore, preferably, the assignment of the phases to the individual phase-shifting regions in the layout regions not provided for modification is performed such that phase conflicts that occur there are displaced into remaining layout regions, the phase conflicts displaced into the remaining layout regions being resolved there by modification of degenerate critical structures and interaction regions and also, if appropriate, overlap regions.

The aim is to perform the assignment of the phases on the basis of the selected layout regions not provided for modification. As a result, these regions can initially be configured free of conflicts. At the same time, phase conflicts that occur there, manifested in an erroneous assignment on both sides of critical structures, are displaced into the remaining layout regions and can be eliminated there through modification of the layout.

The ambiguity of the phase assignment is deliberately utilized in this case, i.e. the assignment of the phases is effected such that no phase conflicts occur in the layout regions not provided for modification.

After the method according to the invention has been carried out, a modified layout is present in which phase-shifting regions with a different phase can be arranged on both sides of all critical structures. Accordingly, the layout is unambiguous with regard to each critical structure and two-colorable in a manner free of conflicts. The modification required for this shall preferably be minimal.

The layout modified by means of the method according to the invention is used as artwork for producing an alternating phase mask, i.e. all the structures (critical and non-critical) and also the phase-shifting regions are transferred to the mask.

Other features which are considered as characteristic for the invention are set forth in the appended claims.

Although the invention is illustrated and described herein as embodied in a method for eliminating phase conflict centers in alternating phase masks, and method for producing alternating phase masks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2A–2F illustrate individual steps of the method according to the invention;

FIGS. 5B–5D illustrate individual steps of the method according to the invention for eliminating the phase conflicts of the layout shown in FIG. 5A;

FIGS. 7A and 7B are two related views showing a layout with end regions and critical interaction regions.

DESCRIPTION OF THE PREFERRED EMBODIMENTS

Figure 1B:
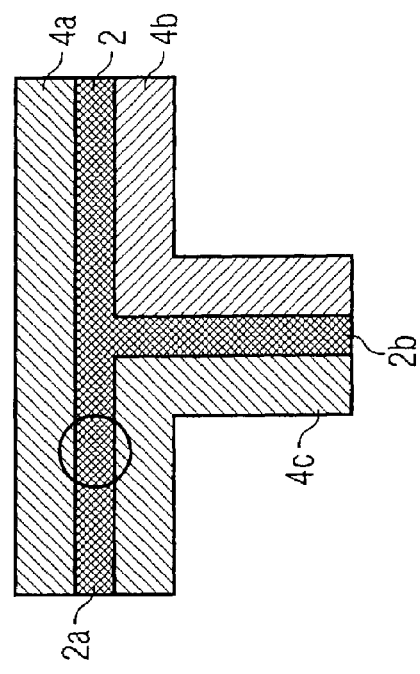
FIGS. 1A–1D are diagrammatic views of related T-shaped structures with phase conflicts and ambiguity of the phase allocation.
Figure 1D:
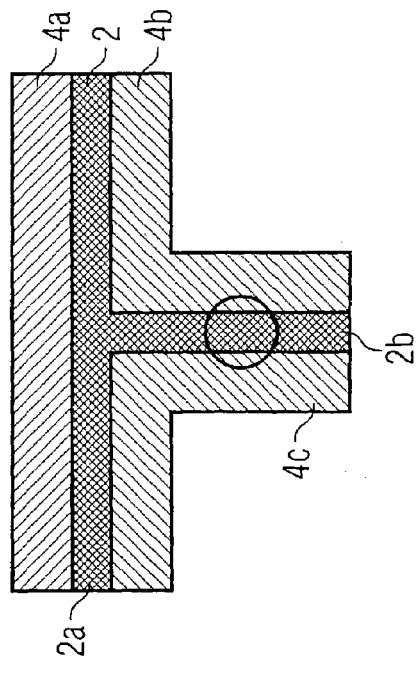
Figure 1A:
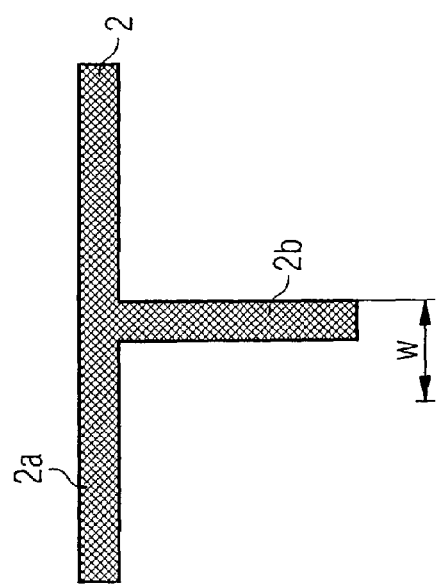
Figure 1C:
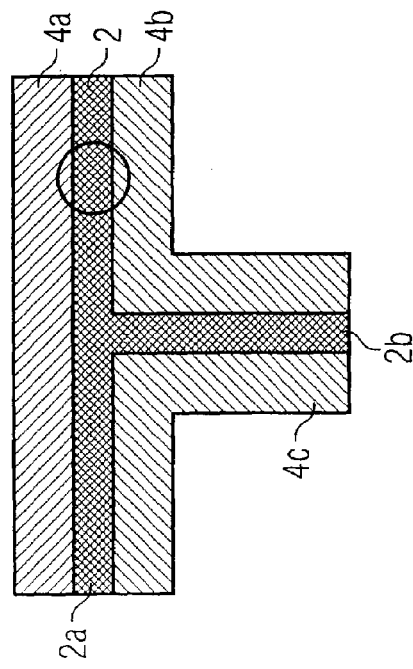

Referring now to the figures of the drawing in detail and first, particularly, to FIGS. 1A to 1D thereof, there is shown a T-shaped structure 2, the limbs of which are formed by critical structures 2a and 2b having a width less than a width W. Therefore, phase-shifting regions 4a, 4b and 4c are necessary on both sides of the critical structures 2a and 2b in order to enable these critical structures to be imaged. The different phases of the phase-shifting regions 4a, 4b and 4c are indicated by different hatching. As can be seen from FIGS. 2B, 2C and 2D, there is no assignment of phase-shifting regions 4a, 4b and 4c in which no phase conflict occurs at one of the two critical structures. The phase conflicts are in each case indicated by a circle.

The elimination of the phase conflicts by the method according to the invention will be explained by way of example using the layout 6 shown in FIG. 2A. Dark regions represent opaque regions on the mask to be produced. Accordingly, a bright-field mask is involved in the present case. However, the method according to the invention can also be applied to dark-field masks. All the dark regions here represent critical structures 8a, 8b, 8c and 8d, which require phase-shifting regions 10a to 10d arranged on both sides for their imaging.

Critical structures can be determined in various ways. The term "critical structure" is used if, proceeding from an arbitrary point on an edge of a structure, points on opposite edges of this structure lie within a circle described around that point, the circle having a radius with the length W. A suitable implementation of this general criterion determines e.g. the minimum distance between two points on opposite edges of the same structure, in which case, for simplification, the measurement can be effected perpendicularly to the course of the edges.

In the assignment of phase-shifting regions 10a, 10b, 10c and 10d to the critical structures 8a, 8b, 8c and 8d, phase conflicts occur, which are indicated by circles in FIG. 2B, i.e. the critical structures are incorrectly bounded by phase-shifting regions having the same phase in these regions.

Furthermore, overlap regions 12a to 12j between straight sections of the critical structures 8a to 8d are determined. In this case, the straight sections are conceptually lengthened by a certain length, e.g. 2W, at bend points. The overlap regions lie in the crossover region with other straight sections of the same critical structure.

Interaction regions and end regions do not occur in this layout. In order to determine these, reference is had to our above-mentioned publication WO 02/09152 A2 and our copending application 10/352,735 and to FIG. 7.

Figure 2D:
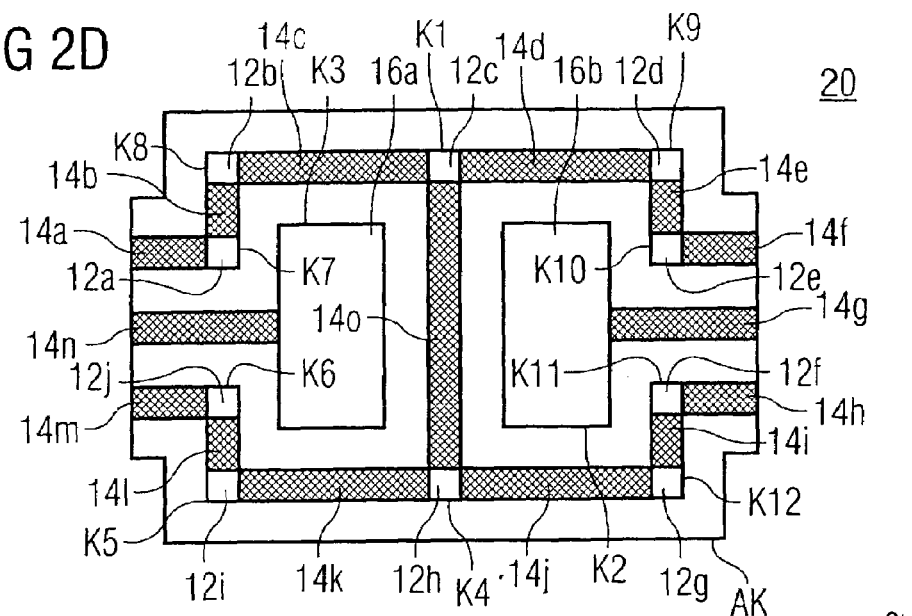

Degenerate critical structures 14a to 14o are then obtained by subtracting the overlap regions 12a to 12j from the critical regions 8a to 8d. Degenerate critical structures thus represent merely straight sections of critical structures running as far as transition regions. If critical structures have no overlap regions, as is the case with the critical structures 8b and 8c, the degenerate critical structures 14g and 14n are formed without subtraction of overlap regions, i.e. these degenerate critical structures correspond to the critical structures 8b and 8c (FIG. 2D).

Next, contiguous layout groups are formed by combination of degenerate critical structures, interaction regions and phase-shifting regions minus all end regions. Interaction regions and end regions are not present with this layout. For their treatment, reference is once more had to our publication WO 02/09152 A2 and to FIG. 7. The outline of the layout group 18 determined in the present case is illustrated in FIG. 2C. All overlap regions 12a and 12j and also the regions 16a and 16b are cut out. Together they form the free regions of the layout group. The free outer region 20 surrounds the layout group 18, whose outer contour is designated by AK.

Next, outer boundaries (combinatorial contours) K1 to K12 are formed around the free regions 12a to 12j and 16a and 16b and the number of paths of contact with degenerate critical structures is determined. As can be discerned in FIG. 2D, the outer boundaries K2 and K3 have in each case one, the outer boundaries K5 to K12 in each case two, and the outer boundaries K1 and K4 in each case three, paths of contact with degenerate critical structures. Since phase conflict centers are present only with an odd number of paths of contact, accordingly only the outer boundaries K1 to K4 indicate phase conflict centers. For the sake of better clarity, the hatching of the phase-shifting regions has been omitted in FIG. 2D.

The regions 16a and 16b are also referred to as real lands and the overlap regions 12c and 12h are referred to as virtual lands.

In order to eliminate the phase conflict centers, a minimal set of degenerate critical structures and overlap regions adjoining the latter is now sought, which lead to the elimination of the phase conflict centers through widening or shifting. As the starting point, it is possible e.g. firstly to choose a base comprising all degenerate critical structures. The smallest set of degenerate critical structures, whose widening or shifting results in the phase conflict centers being eliminated, is determined from said structures. From a mathematical standpoint, what is involved is a combinatorial problem which is a matter of finding the smallest quantity of degenerate critical structures which is necessary to eliminate the phase conflicts.

The starting point for the determination of this minimal set of structures to be modified is the determination of combinatorial connection paths which connect those outer boundaries which indicate a phase conflict center to one another or to the outer contour of the layout group. These are the outer boundaries K1–K4 in the present case.

In the search for this smallest quantity, it is possible, by way of example, firstly to search for those combinatorial connection paths which connect two outer boundaries each indicating a phase conflict center or the outer contour of the layout group to an outer boundary indicating a phase conflict center.

In the present case, the degenerate critical structure 14o connects the two outer boundaries K1 and K4. By contrast, the degenerate critical structures 14g and 14n respectively connect the outer boundaries K2 and K3 to the outer contour AK. Although the widening of the degenerate critical structures 14g and 14n would lead to the elimination of the phase conflict centers K2 and K3, the phase conflict centers K1 and K4 would remain. By contrast, the widening of the degenerate critical structure 14o enables all phase conflict centers present to be eliminated. The reason is that all the outer boundaries K1–K4 are merged with one another. Furthermore, only a single degenerate critical structure is modified, so that the minimal set comprises merely a single structure. The combinatorial connection path VW sought accordingly runs along the degenerate critical structure 14o (see FIG. 2C).

The widening of said degenerate critical structure 14o obviates the sections 11a and 11b (FIG. 2B) on both sides of the phase-shifting regions 10b and 10d. At the same time, the latter are thereby separated, so that each of the phase-shifting regions 10b and 10d has given rise to two independent phase-shifting regions 10b', 10b'', 10d' and 10d'' which can be assigned different phases. As a result of its widening, the degenerate critical structure 14o has thus been converted into a non-critical structure 22.

Figure 2E:
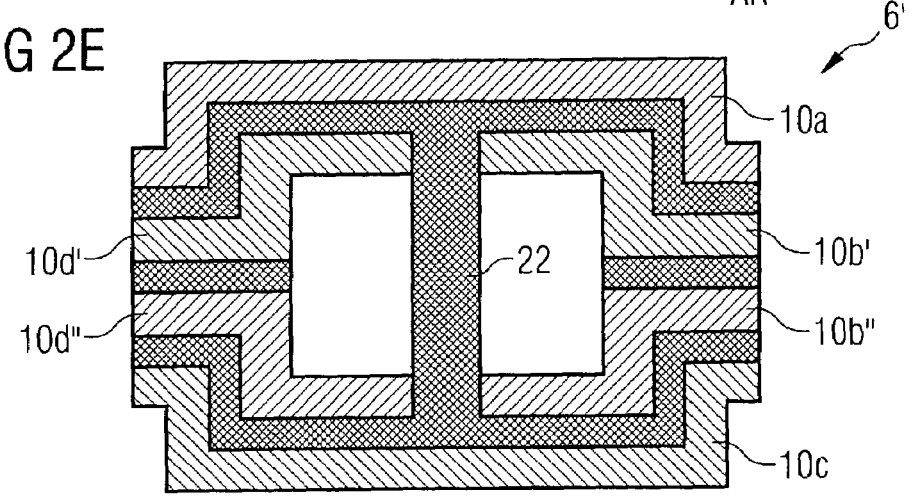
Figure 2F:
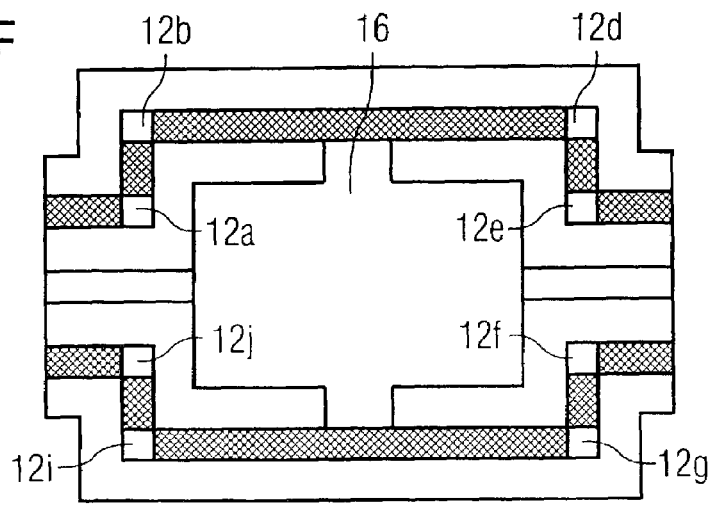

The fact that the method according to the invention is intrinsically consistent is shown by the further application to the layout 6' shown in FIG. 2E, which emerged through modification from the layout 6. FIG. 2F shows the determination of the overlap regions between straight sections of critical structures. Since the originally degenerate critical structure 14o has now become a non-critical structure 22, the latter is no longer taken into account in the determination of the phase conflict centers, i.e. it represents a free region. All the overlap regions 12a, 12b, 12d–12g, 12i and 12j adjoin an even number of degenerate critical structures and thus represent no phase conflict centers. The original overlap regions 12c and 12h now no longer exist. By contrast, within the layout group there is now a single free region 16 present whose outer boundary only makes contact with an even number of degenerate critical structures. Consequently, this layout group is free of phase conflicts. For the sake of better clarity, the hatching of the phase-shifting regions 10a, 10b', 10b", 10c, 10d' and 10d" has been omitted in FIG. 2F.

Figure 3C:
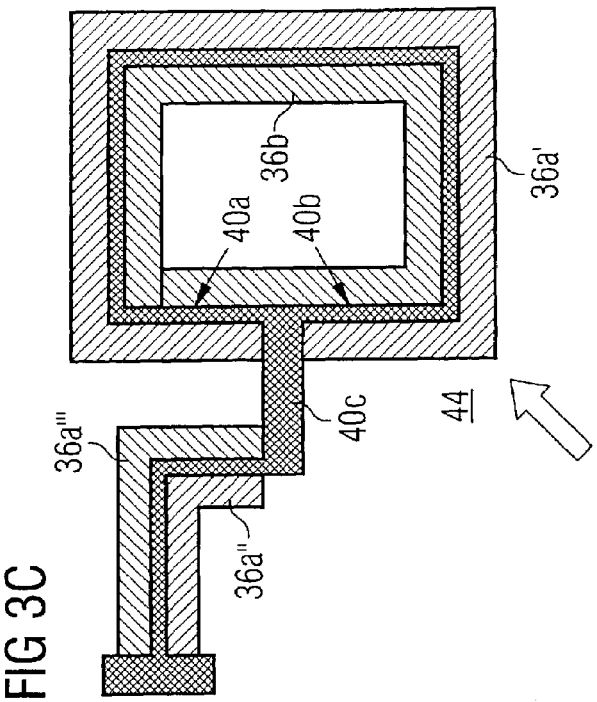
FIGS. 3A–3C illustrate individual steps of the method according to the invention.
Figure 3B:
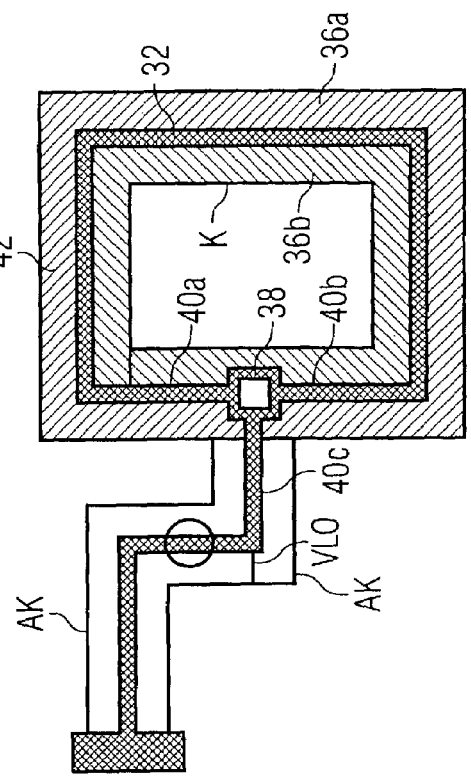
Figure 3A:
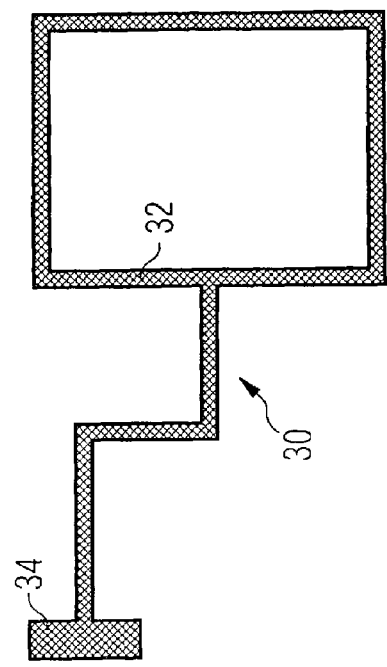

FIG. 3A shows a further layout 30 with a critical structure 32 and a non-critical structure 34. As can be gathered from FIG. 3B, the critical structure 32 is surrounded by phase-shifting regions 36a and 36b having a different phase, but a phase conflict indicated by a circle occurs. The non-critical structure 34 requires no phase-shifting regions. The determination of the phase conflict centers is carried out in the manner explained in connection with FIG. 2. For the sake of clarity, FIG. 3B only indicates the overlap region 38, whose outer boundary K makes contact with three degenerate critical structures 40a, 40b and 40c. The remaining overlap regions have no phase conflict. The free region 44 lying within the layout group 42 is likewise free of phase conflicts. Accordingly, only a single phase conflict center is present. The layout group 42 here comprises the phase-shifting regions 36a, 36b and the degenerate critical structures. Like the non-critical structure 34, the overlap regions do not belong to the layout group 42.

The combinatorial connection path VW sought runs along the degenerate critical structure 40c and connects the outer boundary of the overlap region 38 to the outer contour AK. The degenerate critical structure 40c is correlated longitudinally with regard to the outer boundary of the overlap region 38 and transversely with regard to the outer contour.

FIG. 3C shows the elimination of the phase conflict center by the widening of the degenerate critical structure 40c, which is converted into a non-critical structure. The adjacent phase-shifting regions are thereby obviated, so that the originally contiguous phase-shifting region 36a has now decomposed into three separate phase-shifting regions 36a', 36a" and 36a'", which can be assigned different phases. The phase conflict indicated by the circle in FIG. 3b can thereby be eliminated. The widening of one of the other two degenerate critical structures 40a and 40b would likewise lead to the elimination of the phase conflict. The solution presented here has the effect that the virtual land formed by the overlap region 38 is connected to the free outer region 44 surrounding the layout group.

Figure 4A:
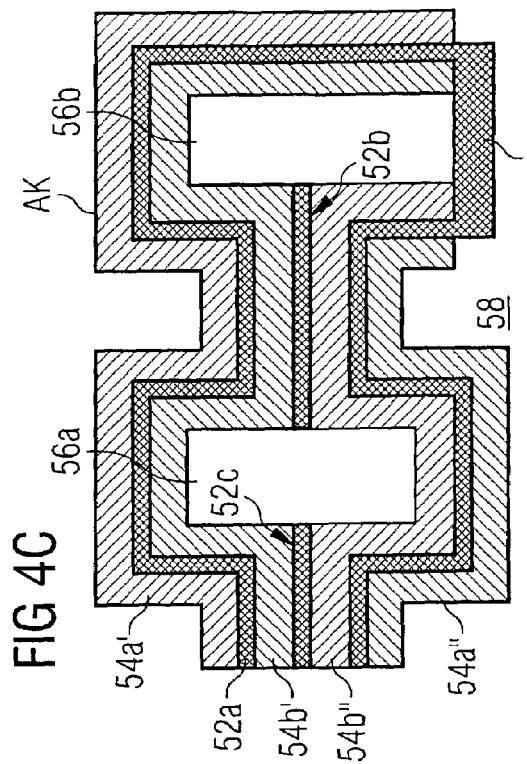
FIGS. 4A–4D illustrate individual steps of the method according to the invention.
Figure 4C:
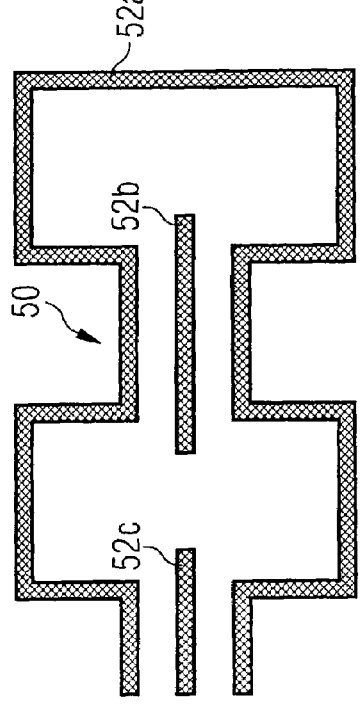
Figure 4B:
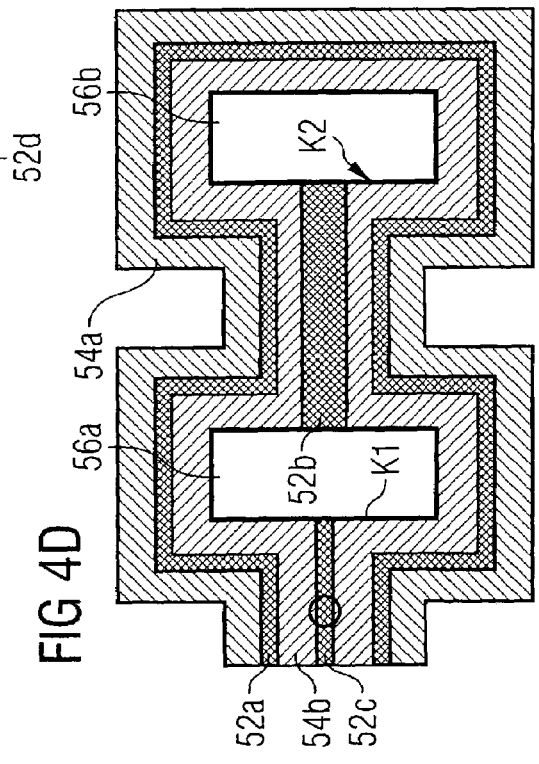

FIG. 4A shows a further layout 50 with a multiplicity of critical structures 52a–52c. The associated phase-shifting regions 54a and 54b are illustrated in FIG. 4B. In this layout there are no overlap regions which indicate a phase conflict center, since each overlap region makes contact with an even number of degenerate critical structures, two in the concrete case considered here. Phase conflicts that actually occur are again indicated by circles. The outer boundary K1 of the free region 56a makes contact with two degenerate critical structures, which are identical to the critical structures 52b and 52c in the present case since they have no overlap regions. By contrast, the outer boundary K2 of the free region 56b has only one path of contact with the degenerate structure 52b. A phase conflict center is thus indicated by this outer boundary.

FIG. 4 shows particularly clearly the possible delocalization of phase conflict center and phase conflict that actually occurs. Only the outer boundary K2 was determined as phase conflict center. However, the phase conflicts actually observed are in part considerably remote therefrom, in particular the phase conflict produced around the degenerate critical structure 52c.

The modification of the degenerate critical structures 52b and 52c is appropriate, by way of example, for eliminating the phase conflict center. By widening the degenerate critical structure 52b, the latter would be converted into a non-critical structure and a connection between the real lands 56a and 56b would be produced. Although the phase-shifting regions surrounding the degenerate critical structure 52b would not be omitted, since they are still required for the critical structure 52a, an erroneous phase allocation on both sides of a non-critical structure is harmless. As a result, the phase conflict center indicated by the outer boundary K would initially be resolved, but a new phase conflict center automatically arises since the outer boundary of the now united free regions 56a and 56b would make contact with the degenerate critical structure 52c. It must be taken into consideration here that the widened degenerate critical structure 52b, which is now no longer to be regarded as critical, is not part of the layout group and a connection between the regions 56a and 56b is thereby produced.

Figure 4D:
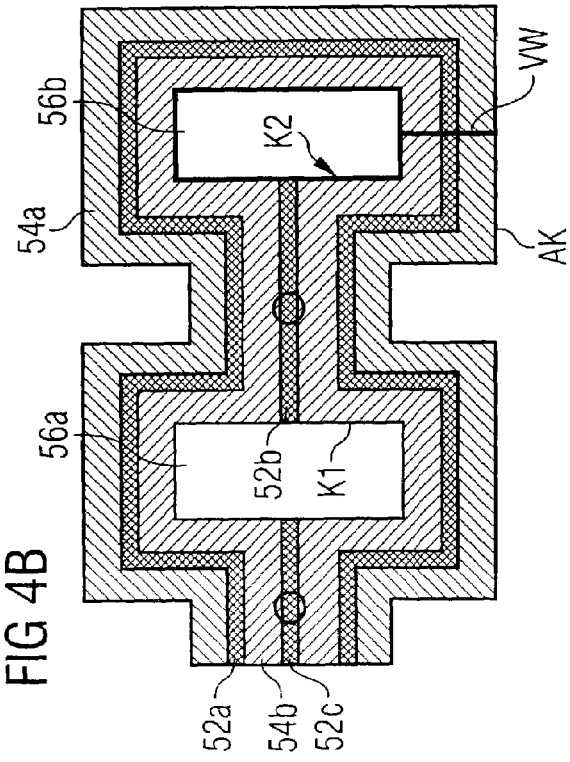

In order to resolve the new phase conflict center, the degenerate critical structure 52c would also additionally have to be widened. The modification of the degenerate critical structure is shown in FIG. 4D. Accordingly, two degenerate critical structures would have to be modified in this solution.

By contrast, it is more advantageous to modify the degenerate critical structure 52d, which, as a result of its widening, produces a connection between the outer boundary K2 of the free region 56b and the outer contour AK of the layout group. The free outer region around the layout group is designated by 58. In this solution shown in FIG. 4D, only a single degenerate critical structure has to be modified, as a result of which the requirement of the minimal set of modified degenerate critical structures is satisfied here. As a result of the modification presented here, the phase-shifting regions 54a and 54b are each separated into two subregions, as can be seen in FIG. 4C. The combinatorial connection path VW sought is indicated in FIG. 4B. The degenerate critical structure 52d is a transversely correlated degenerate critical structure.

It shall be pointed out here once again that firstly individual combinatorial connection paths are sought and then a check is made to determine whether a modification of degenerate critical structures, overlap regions and/or interaction regions along said connection paths leads to the elimination of the phase conflict centers. If this is not the case or if this is the case only in part, other or additional combinatorial connection paths are included in the check until all the phase conflict centers are eliminated. In this case, it is endeavored to minimize the quantity of combinatorial connection paths and ultimately to minimize the quantity of structures to be modified.

Figure 5A:
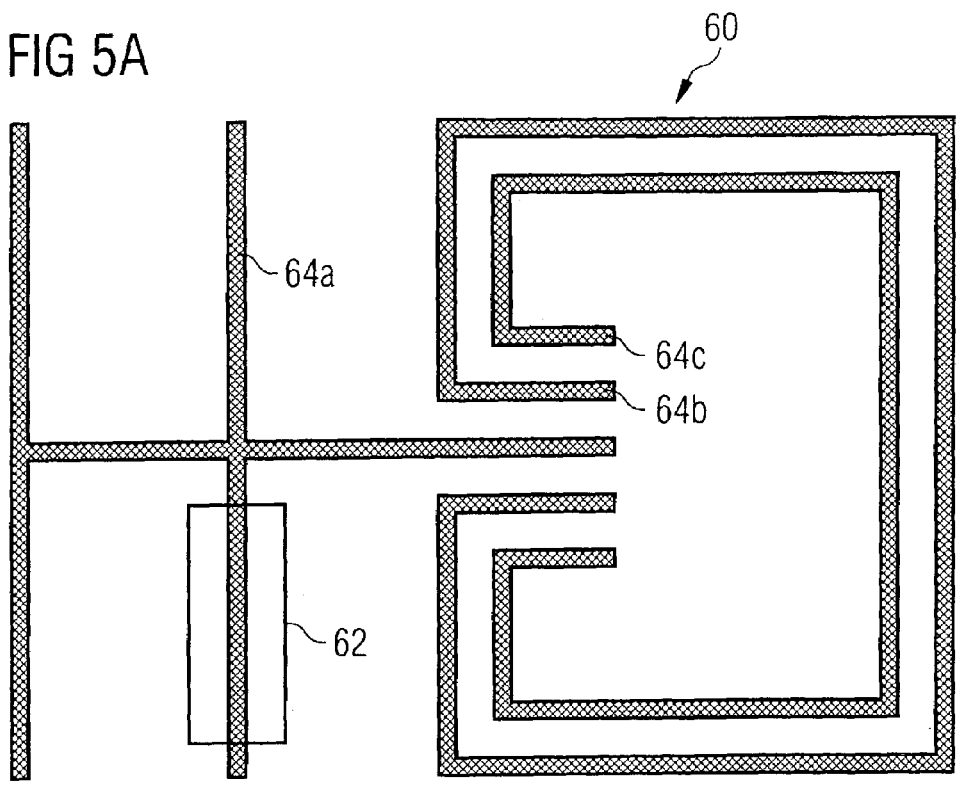
FIG. 5A is a plan layout view with selected structures not provided for modification.

FIG. 5A shows a more complex layout 60, in the selected region 62 of which no modification is to be performed. The layout comprises the critical structures 64a, 64b and 64c.

Figure 5B:
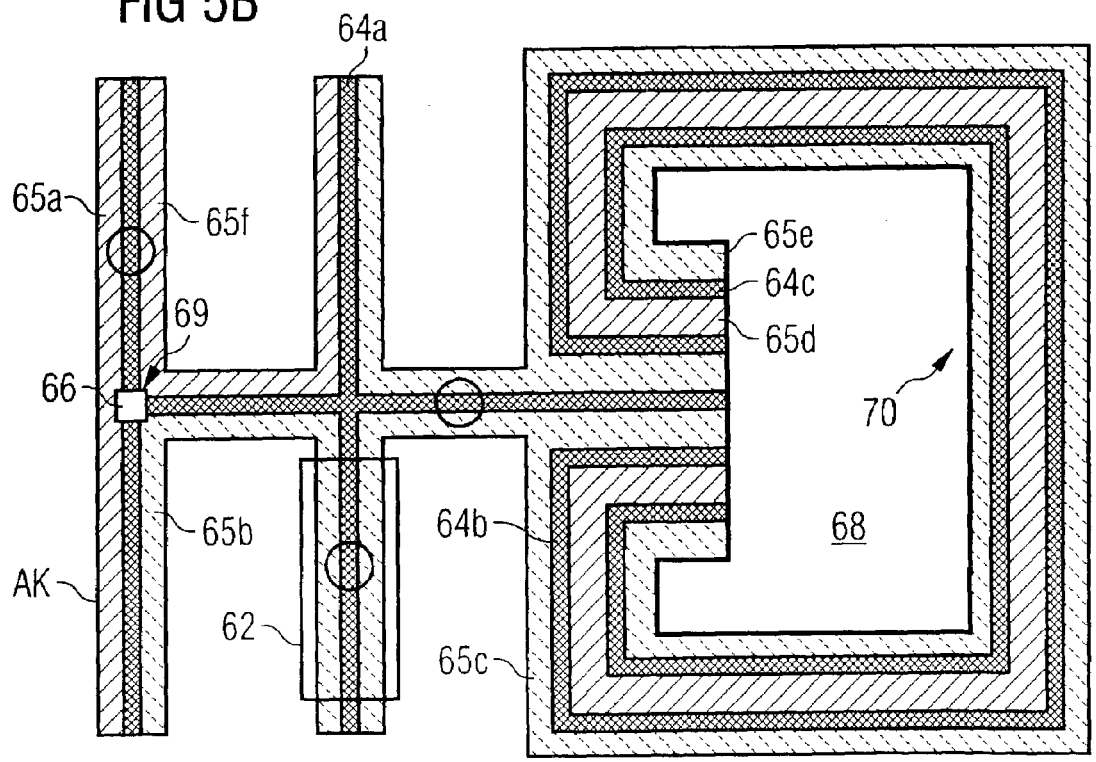

FIGS. 5B and 5C show different assignments of contiguous phase regions 65a to 65f to the critical structures 64a to 64c, different phases being indicated by different hatching. In FIG. 5B, a phase conflict is marked within the selected layout region 62. This phase conflict, in the same way as the other phase conflicts indicated by a respective circle, stem on the one hand from the T-shaped structure 66 arranged on the left, whose overlap region has an outer boundary 69 with contact made by three degenerate critical structures. Furthermore, the free region 68 has a phase conflict since its outer boundary 70 makes contact with five degenerate critical structures. In order that these phase conflict centers do not lead to phase conflicts in the selected layout region 62, the assignment of the phases of the individual phase regions 65c and 65b is performed there such that the critical structure 64a running in the selected layout region is bounded by phase-shifting regions having a different phase. The changed phase assignment is an expression of the ambiguity of the phase allocation which is automatically utilized in the case of a reduced base. The changed assignment of the phase can be seen in FIG. 5C. On account of this re-arrangement, the phase conflicts observed are displaced into the remaining, non-selected layout regions, where they can be eliminated by modification of degenerate critical structures. Widening of the degenerate critical structures that connect the outer boundaries 69 and 70 is appropriate in the present case. If desired, the transition regions arranged along this connection can likewise be widened. The result of the layout modification with the structure 71, which is now to be regarded as non-critical, is shown in FIG. 5D. In this example, the combinatorial connection path VW sought runs outside the selected layout region 62 from the outer boundary 70 along the structure 71 to the outer boundary 69.

Figure 6A:
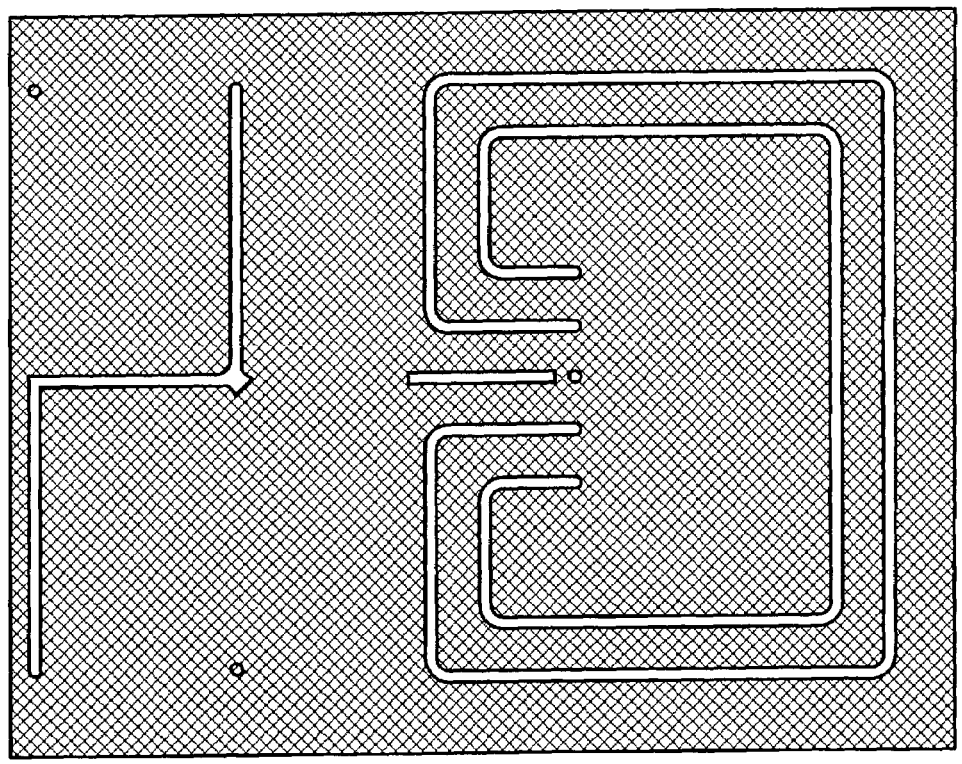
FIGS. 6A and 6B illustrate simulations of the imaging of the layout before and after the elimination of the phase conflicts of the layout shown in FIG. 5.
Figure 6B:
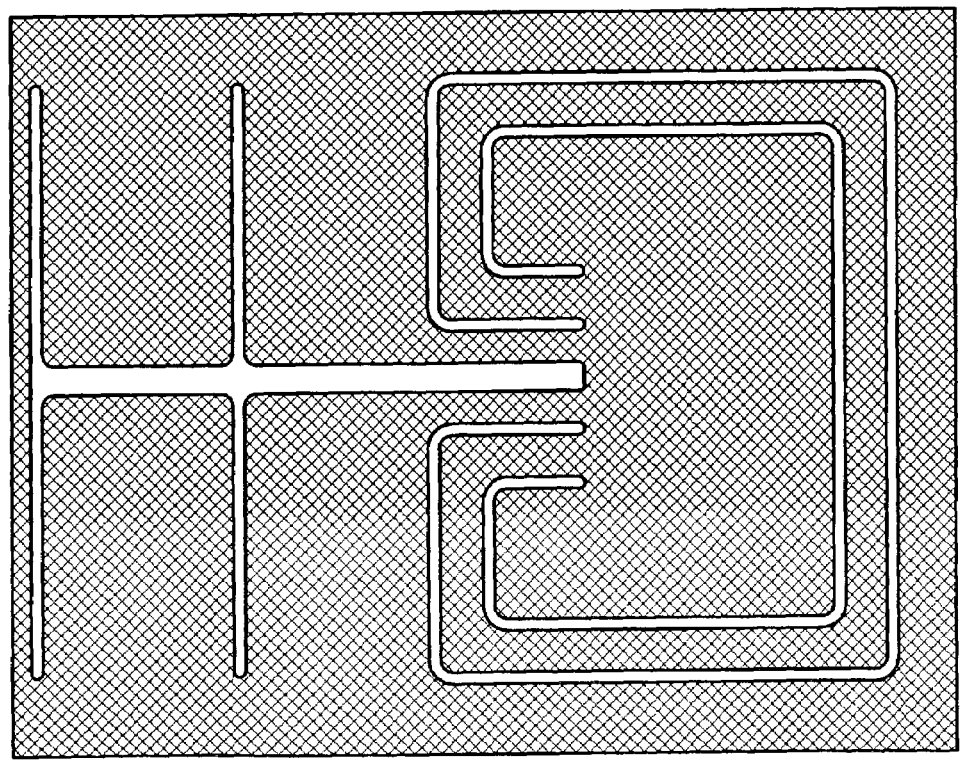

The clear effects of this layout modification are shown in FIGS. 6A and 6B using aerial image simulations. A wavelength of 248 nm and a width of the critical structures of 140 nm were taken as a basis in this case. FIG. 6A shows the simulated imaging of the layout shown in FIG. 5B. Wherever phase regions having the same phase are arranged on both sides of critical structures, the imaging of the relevant critical structure is either erroneous or completely fails to happen. By contrast, FIG. 6b shows a satisfactory imaging of all structures, the layout including the phase assignment in accordance with FIG. 5D having been taken as a basis.

Figure 7A:
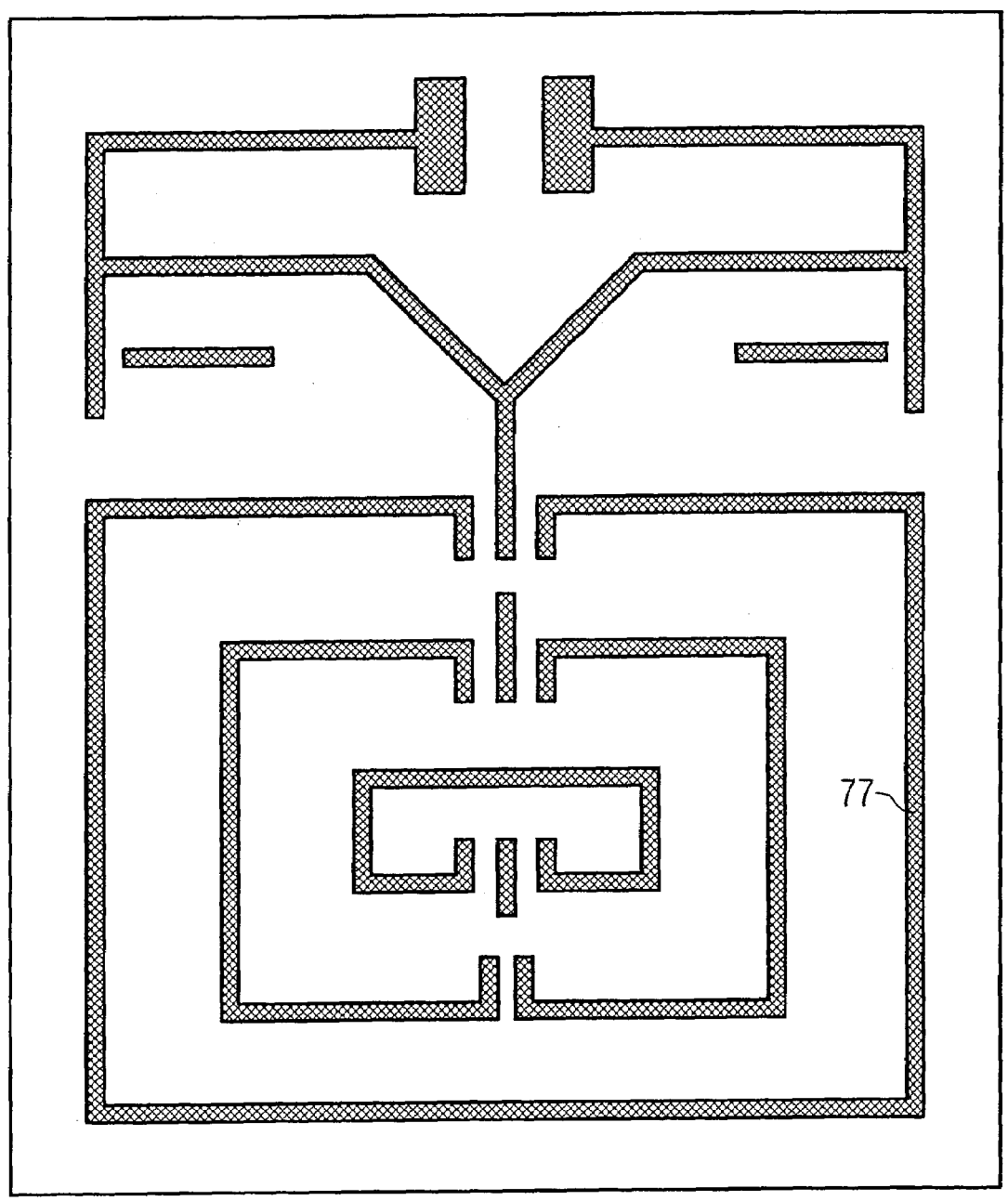

FIGS. 7A and 7B once again serve for illustrating all possible phase conflict centers. FIG. 7A illustrates a layout 77 and FIG. 7B illustrates the associated combinatorial layout region 78 with critical structures 80, 88, 96, their overlap regions 82 and phase-shifting regions 84, 90, 98 and 100. 86 designates an end region of the critical structure 88, which ends in the middle of a phase-shifting region 90. This end region is shown enlarged in detail a). Numeral 92 designates the outer boundary of the end region.

Furthermore, FIG. 7B shows an end region 94—representing a phase conflict center—of the critical structure 96, which ends in the midst of interaction regions between phase-shifting regions. As shown in the enlarged detail b), the phase-shifting regions 90 and 98 and respectively 100 come very close to one another, i.e. they fall below a minimum distance which is significantly less than W. As a result, undesirable destructive interference can occur there during the imaging of the phase mask. 106 designates the outer boundary of the end region 94. The outer boundaries K1–K3 indicate the known phase conflict centers at T-structures, whereas the outer boundaries K4–K6 indicate those of inner free regions of individual layout groups. Although these layout groups are nested in one another, the phase conflict centers can be eliminated independently of one another. The three layout groups together form the combinatorial layout group region.

Figure 8A:
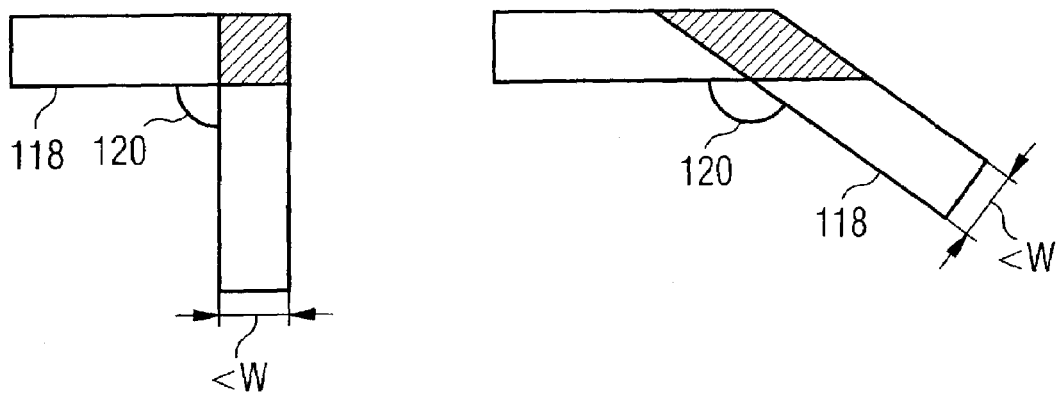
FIGS. 8A–8C illustrate exemplary details for determining overlap regions and end regions.

FIG. 8A illustrates the formation of overlap regions, which are shown hatched there. The critical structures have a width of less than W and, after lengthening by, say, 2W, make contact with one another at an angle 120°. The region of their overlap defines the respective overlap region.

Figure 8B:
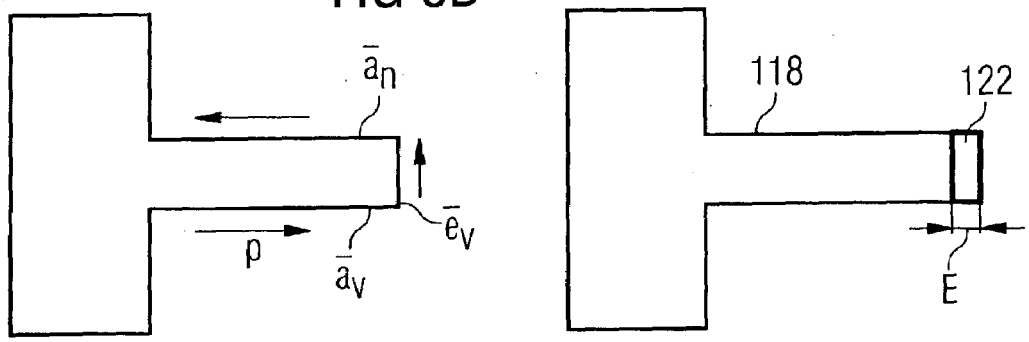

FIG. 8B provides indications for the determination of end regions 122. The latter are situated at the critical (narrow) edge of critical structures 118. Generally, an end region is formed by infinitesimal lengthening of a critical structure at its narrow edge. The lengthening E may amount to e.g. 10 nm.

The determination is effected, in the case of outer contours, in the mathematically positive sense, i.e. in the counter-clockwise direction, as indicated in FIG. 8A. The individual edges of the critical structure are represented by mathematically positively oriented vectors, where $\vec{a}_v$ denotes the vector of the preceding edge, $\vec{e}$ denotes the vector of the end edge, and $\vec{a}_n$ denotes the vector of the succeeding edge, which are covered one after the other. A narrow (critical) edge of a critical structure is present when the following conditions are met:

$\vec{a}_v \times \vec{e} > 0$ (here× denotes the cross product of the vectors);

$\vec{e} \times \vec{a}_n > 0$ (here× denotes the cross product of the vectors);

the magnitude of the angle between the vectors $\vec{a}_v$ and $\vec{a}_n$ is $180° +/- \Delta\alpha$, with $\Delta\alpha$ approximately 20–30°;

the length of $\vec{e}$ is less than W.

Figure 8C:
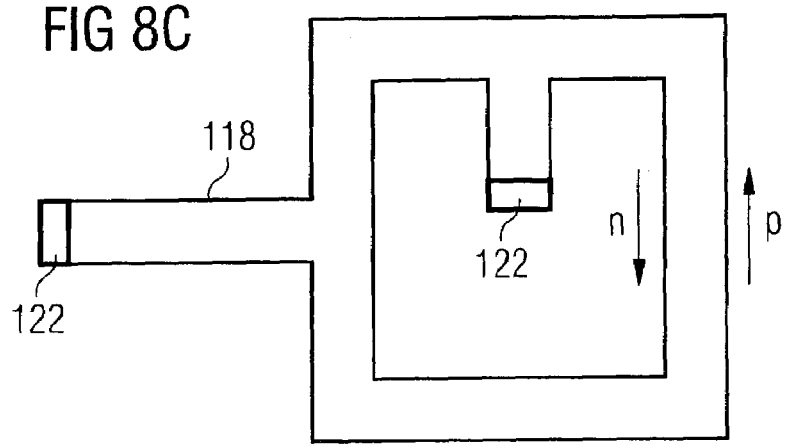

In the case of inner contours, this algorithm is applied in the mathematically negative sense, as indicated in FIG. 8C.

We claim:

1. A method of eliminating phase conflict centers in alternating phase masks, wherein a predetermined layout having structures provided for imaging is taken as a basis, the method which comprises the following steps:

determining critical structures having a width less than a predetermined width W and being bounded by phase-shifting regions on both sides;

determining:
  overlap regions between straight segments of the critical structures,
  interaction regions between phase-shifting regions; and
  end regions of the critical structures, degenerate critical structures formed by subtracting the overlap regions from the critical structures;

forming layout groups by combining degenerate critical structures, phase-shifting regions, and interaction regions between phase-shifting regions minus all the end regions;

forming outer boundaries around free regions within the layout groups, and thereby determining from each outer boundary a number of paths of contact with the degenerate critical structures and ascertaining a phase conflict center if the number is an odd number;

determining combinatorial connection paths either connecting two outer boundaries representing phase conflict centers to one another or connecting an outer boundary representing a phase conflict center to the outer contour of a layout group thereof, wherein only an odd number of combinatorial connection paths proceed from each outer boundary representing a phase conflict center; and modifying degenerate critical structures and interaction regions and also, if appropriate, overlap regions running along the combinatorial connection paths or being in contact therewith, to thereby eliminate the phase conflict centers.

2. The method according to claim 1, which further comprises minimizing a quantity of combinatorial connection paths.

3. The method according to claim 1, which further comprises determining the combinatorial connection paths with combinatorial elements from a general base comprising all degenerate critical structures and all interaction regions between phase-shifting regions.

4. The method according to claim 1, which further comprises determining the combinatorial connection paths with combinatorial elements from a reduced base comprising all degenerate critical structures and all interaction regions between phase-shifting regions minus all degenerate critical structures lying in selected layout regions not provided for modification.

5. The method according to claim 4, which further comprises:
performing an assignment of the phases to the individual phase-shifting regions in the layout regions not provided for modification to thereby displace phase conflicts occurring there into remaining layout regions; and
resolving the phase conflicts displaced into the remaining layout regions in the remaining layout regions by modifying degenerate critical structures and interaction regions and also, if appropriate, overlap regions.

6. The method according to claim 1, which further comprises determining the combinatorial connection paths with combinatorial elements from an extended base comprising extended base elements.

7. The method according to claim 1, which further comprises determining the combinatorial connection paths such that each combinatorial connection path makes contact with at least one degenerate critical structure and/or an interaction region.

8. The method according to claim 1, which further comprises selecting for the modification a process from the group consisting of at least partial widening and partial shifting of degenerate critical structures, interaction regions and, if appropriate, of overlap regions.

9. The method according to claim 8, which further comprises widening the degenerate critical structures to effect a width thereof greater than W and to thereby convert the structures into non-degenerate structures, and to thereby obviate the phase-shifting regions on both sides of the structures.

10. The method according to claim 8, which further comprises modifying only segments of degenerate critical structures.

11. The method according to claim 10, wherein the modifying step comprises widening the segments.

12. The method according to claim 1, wherein the combinatorial connection paths run along the degenerate critical structures.

13. The method according to claim 1, wherein the combinatorial connection paths run transversely to the degenerate critical structures.

14. The method according to claim 1, which further comprises eliminating phase conflicts in the region of the interaction regions by a process selected from the group consisting of shifting and widening adjoining degenerate critical structures.

15. The method according to claim 1, which further comprises, as an alternative or in addition, resolving phase conflicts in the region of the interaction regions, by introducing phase-shifting regions with an intermediate phase or by the use of trimming masks.

16. The method according to claim 1, which further comprises modifying those degenerate critical structures and, if appropriate, overlap regions whose modification leads to a destruction of phase-shifting regions and thus to a union of an even number of outer boundaries representing phase conflict centers or of outer boundaries representing phase conflict centers with an outer contour of a layout group.

17. The method according to claim 1, which further comprises modifying those degenerate critical structures and, if appropriate, overlap regions whose modification leads to a destruction of phase-shifting regions and thus to a union of an odd number of outer boundaries representing phase conflict centers with at least one interaction region.

18. In a method for producing an alternating phase mask, which comprises designing the alternating phase mask based on a predetermined layout having structures provided for imaging, eliminating phase conflict centers in the alternating phase mask by performing the method according to claim 1 to form a modified layout, and fabricating the phase mask according to the modified layout.

* * * * *